United States Patent
Miyashita et al.

(10) Patent No.: US 9,006,759 B2
(45) Date of Patent: Apr. 14, 2015

(54) LIGHT-EMITTING DEVICE

(75) Inventors: Junji Miyashita, Yamanashi-ken (JP);
Kosuke Tsuchiya, Yamanashi-ken (JP);
Nodoka Oyamada, Yamanashi-ken (JP)

(73) Assignees: Citizen Electronics Co., Ltd., Yamanashi-Ken (JP); Citizen Holdings Co., Ltd., Tokyo (JP)

( * ) Notice: Subject to any disclaimer, the term of this patent is extended or adjusted under 35 U.S.C. 154(b) by 181 days.

(21) Appl. No.: 13/641,293

(22) PCT Filed: Apr. 14, 2011

(86) PCT No.: PCT/JP2011/059232
§ 371 (c)(1),
(2), (4) Date: Oct. 15, 2012

(87) PCT Pub. No.: WO2011/129383
PCT Pub. Date: Oct. 20, 2011

(65) Prior Publication Data
US 2013/0033186 A1    Feb. 7, 2013

(30) Foreign Application Priority Data
Apr. 15, 2010  (JP) .................. 2010-094351

(51) Int. Cl.
*H01L 33/00*   (2010.01)
*H01L 21/00*   (2006.01)
(Continued)

(52) U.S. Cl.
CPC ............ *H01L 25/0753* (2013.01); *H01L 33/38* (2013.01); *H01L 24/06* (2013.01);
(Continued)

(58) Field of Classification Search
CPC ....... H01L 25/073; H01L 33/62; H01L 33/38; H01L 24/06; H01L 25/0753; H01L 33/486; H01L 2224/73265; H01L 2224/48227
See application file for complete search history.

(56) References Cited

U.S. PATENT DOCUMENTS 5,489,800 A * 2/1996 Brown et al. .................. 257/666
5,677,245 A * 10/1997 Brown et al. .................... 438/25
(Continued)

FOREIGN PATENT DOCUMENTS

EP          1249876 A2    10/2002
JP      2006147214 A      6/2006
(Continued)

OTHER PUBLICATIONS

Chinese Notification of the First Office Action of Chinese Appln. No. 20118026130.7 dated Nov. 18, 2014.

*Primary Examiner* — Alonzo Chambliss
(74) *Attorney, Agent, or Firm* — Browdy and Neimark, PLLC

(57) ABSTRACT

A light-emitting device is provided that aims not to affect a service life and characteristics of light emission and includes two electrodes formed on the upper surface of a substrate with a gap at a central portion of the upper surface of the substrate between the two electrodes, a first light-emitting diode element mounted on the first electrode, and a second light-emitting diode element mounted on the second electrode. The first light-emitting diode element includes a pair of element electrodes on an upper surface of the first light-emitting diode element and the second light-emitting diode element includes a pair of element electrodes on an upper surface of the second light-emitting diode element. The first light-emitting diode element is connected by a wire to the first electrode and/or the second electrode. The second light-emitting diode element is connected by a wire to the first electrode and/or the second electrode.

17 Claims, 12 Drawing Sheets

(51) Int. Cl.
- *H01L 25/075* (2006.01)
- *H01L 33/38* (2010.01)
- *H01L 23/00* (2006.01)
- *H01L 33/48* (2010.01)
- *H01L 33/62* (2010.01)

(52) U.S. Cl.
CPC .............. *H01L 33/486* (2013.01); *H01L 33/62* (2013.01); *H01L 2224/48227* (2013.01); *H01L 2224/73265* (2013.01)

(56) References Cited

U.S. PATENT DOCUMENTS

| | | | |
|---|---|---|---|
| 5,753,929 A * | 5/1998 | Bliss | 250/551 |
| 6,054,716 A * | 4/2000 | Sonobe et al. | 250/552 |
| 6,747,293 B2 * | 6/2004 | Nitta et al. | 257/99 |
| 6,759,667 B2 * | 7/2004 | Yasuda | 250/551 |
| 7,164,159 B2 * | 1/2007 | Park et al. | 257/99 |
| 7,235,804 B2 * | 6/2007 | Aki | 250/551 |
| 7,242,032 B2 * | 7/2007 | Oshio | 257/99 |
| 7,719,023 B2 * | 5/2010 | Oshio | 257/99 |
| 7,893,444 B2 * | 2/2011 | Hsu et al. | 257/79 |
| 2006/0249746 A1 | 11/2006 | Oshio | |
| 2010/0157583 A1 * | 6/2010 | Nakajima | 362/184 |
| 2010/0295068 A1 * | 11/2010 | Seo et al. | 257/89 |
| 2013/0307014 A1 * | 11/2013 | Yamamoto et al. | 257/99 |

FOREIGN PATENT DOCUMENTS

| | | |
|---|---|---|
| JP | 2006165097 A | 6/2006 |
| JP | 2008258264 A | 10/2008 |
| JP | 2009083653 A | 12/2009 |

\* cited by examiner

LIGHT-EMITTING DEVICE

FIELD

The present invention relates to a light-emitting device, and more specifically, to a light-emitting device configured such that a plurality of light-emitting diode elements are used as light sources for various illumination purposes.

BACKGROUND

As a result of the advent of a long-life blue light-emitting diode with low power consumption in recent years, a light-emitting diode (LED) element has been mounted widely not only on various illumination devices but also on many electronic devices typified by mobile phones and various control devices. If used as a light source of such illumination devices, key illumination of electronic devices, and backlight, for example, a single LED element is not enough to provide a sufficient amount of light. Accordingly, a plurality of LED elements arranged in a light-emitting device have been employed.

Japanese Patent Application Laid-Open No. 2009-283653 discloses a light-emitting device known as an example of the aforementioned conventional device. As shown in FIG. 12, this light-emitting device includes a substrate 1 composed of a metal plate divided into a first portion 2 and a second portion 3 with a gap 8 provided therebetween, a plurality of LED elements 5 mounted on the second portion 3 of the substrate 1 and electrically connected to the first portion 2 through wires 4, a reflecting frame 6 surrounding the LED elements 5, and a light-transmitting member 7 sealing the LED elements 5.

The conventional light-emitting device with this structure allows heat generated due to the light emission of the LED elements 5 to be dissipated from the substrate 1 composed of the metal plate or the reflecting frame 6.

CITATION LIST

Patent Literature

Patent Literature 1: Japanese Patent Application Laid-Open No. 2009-283653

SUMMARY

Technical Problem

In the conventional light-emitting device described in Japanese Patent Application Laid-Open No. 2009-283653, however, the LED elements 5 are mounted only on the second portion 3 of the substrate 1. Accordingly, heat generated due to the light emission of the LED elements 5 concentrates at the second portion 3, leading to the fear that the heat will not be dissipated from the substrate 1 effectively. In particular, if more LED elements 5 are mounted on the second portion 3, a great amount of heat is generated in the second portion 2. This may adversely affect the service life of the light-emitting device. Additionally, if more LED elements 5 are mounted on the second portion 3, a distance between adjacent LED elements 5 is shortened. In this case, light rays emitted from the LED elements 5 interfere with each other, so that light emission characteristics may be affected adversely.

There is an object of the invention to provide a light-emitting device that aims not to affect a service life and characteristics of light emission by releasing heat from a substrate on that a plurality of LED elements are mounted, and the LED elements generate the heat.

Solution to Problem

In order to solve the aforementioned problem, a light-emitting device of the invention includes: a substrate; a first electrode and a second electrode formed on the entire upper surface of the substrate with a gap between the first electrode and the second electrode, the gap being provided at a central portion of the upper surface of the substrate; at least one first light-emitting diode element mounted on the first electrode; and at least one second light-emitting diode element mounted on the second electrode. The first light-emitting diode element includes a pair of element electrodes as a first element electrode and a second element electrode on an upper surface of the first light-emitting diode element and the second light-emitting diode element includes a pair of element electrodes as a first element electrode and a second element electrode on an upper surface of the second light-emitting diode element. The first light-emitting diode element is connected by a wire to at least one of the first electrode and the second electrode, and the second light-emitting diode element is connected by a wire to at least one of the first electrode and the second electrode.

According to one embodiment of the present invention, the first element electrode of the pair of element electrodes of the first light-emitting diode element is connected by a wire to the second electrode, and the second element electrode of the pair of element electrodes of the first light-emitting diode element is connected by a wire to the first electrode. The first element electrode of the pair of element electrodes of the second light-emitting diode element is connected by a wire to the first electrode, and the second element electrode of the pair of element electrodes of the second light-emitting diode is connected by a wire to the second electrode. According to such a connection mentioned above, the first and second light-emitting diode elements are electrically connected in parallel to each other.

According to another embodiment of the invention, a first element electrode of the pair of element electrodes of the first light-emitting diode element is connected to a second element electrode of the second light-emitting diode element, and the second element electrode of the pair of element electrodes of the first light-emitting diode element is connected by a wire to the first electrode.

The second element electrode of the pair of element electrodes of the second light-emitting diode element is connected to the first element electrode of the first light-emitting diode element, and first element electrode of the pair of element electrodes the second light-emitting diode element is connected by a wire to the second electrode. According to such a connection, the first light-emitting diode element and the second light-emitting diode element are electrically connected in series.

According to still another embodiment, the substrate includes an elongated shape, the first electrode includes an elongated shape extending along the elongated shape of the substrate and the second electrode includes an elongated shape extending along the elongated shape of the substrate, an elongated gap in the form of a slit is provided between the first electrode and the second electrode, a plurality of the first light-emitting diode elements are mounted on the first electrode and a plurality of the second light-emitting diode elements are mounted on the second electrode, the first light-emitting diode elements and the second light-emitting diode elements are disposed to be a plurality of pairs each with one first light-emitting diode element and one second light-emitting diode element; and in each pair of the plurality of pairs, the first light-emitting diode element is electrically connected by a wire, and the second light-emitting diode element is electrically connected to at least one of the first electrode and the second electrode by a wire.

According to still another embodiment, the first includes a first inner portion adjacent to the gap and the second electrode includes a second inner portion adjacent to the gap, and a first outer portion positioned outside of the first inner portion, a second outer portion positioned outside of the second inner portion. The first inner portion of first electrode includes a first inner edge defining one side of the gap between the first electrode and the second electrode, the second inner portion of second electrode includes a second inner edge defining another side of the gap between the first electrode and the second electrode. The first outer portion of the first electrode includes a first outer edge at an opposite side of the first inner edge of the first inner portion, and is an area positioned outside of a center line between the first inner edge and the first outer edge, the second outer portion of the second electrodes includes a second outer edge at an opposite side of the second inner edge. The first light-emitting diode element is mounted on the first outer portion of the first electrode, and is connected by a wire to at least one of the first inner portion of the first electrode and the second inner portion of the second electrode. The second light-emitting diode element is mounted on the second outer portion of the second electrode, and is connected by a wire to at least one of the first inner portion of the first electrode and the second inner portion of the second electrode.

Advantageous Effects of Invention

According to the present invention, the first electrode and the second electrode are arranged with a gap between the first electrode and the second electrode, the gap being provided at a central portion of the substrate, and the first LED element is disposed on the first electrode and the second LED element is disposed on the second electrode. Thus, heat generated from the LED elements that emit light is allowed to be dissipated from the substrate through the first electrode on that the first LED element is mounted and through the second electrode on that the second LED element is mounted. This enhances the effective dissipation of heat, and it is possible to avoid an influence caused by heat generated by the first and second LED elements.

Further, if the first LED element in a pair is arranged on the first outer portion of the first electrode and the second LED element in the pair is arranged on the second outer portion of the second electrode, a distance from the first LED element to the gap is increased and a distance from the second LED element to the gap is increased. Accordingly, the amount of light emission from the first LED element and the second LED element affecting an upper surface of the substrate appearing in the gap can be reduced, and thus, it is possible to avoid a deterioration of substrate caused by light exposure effectively.

DESCRIPTION OF EMBODIMENTS

First Embodiment

Figure 1:
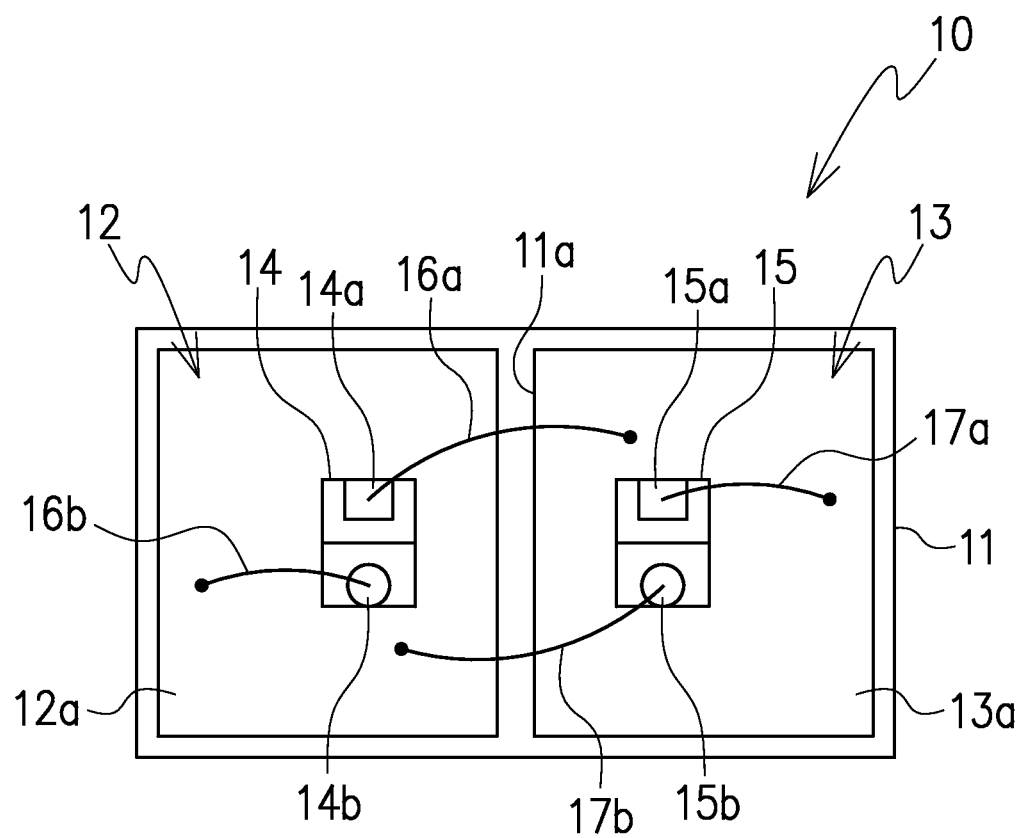
FIG. 1 is a plan view showing a light-emitting device according to a first embodiment of the present invention.
Figure 2:
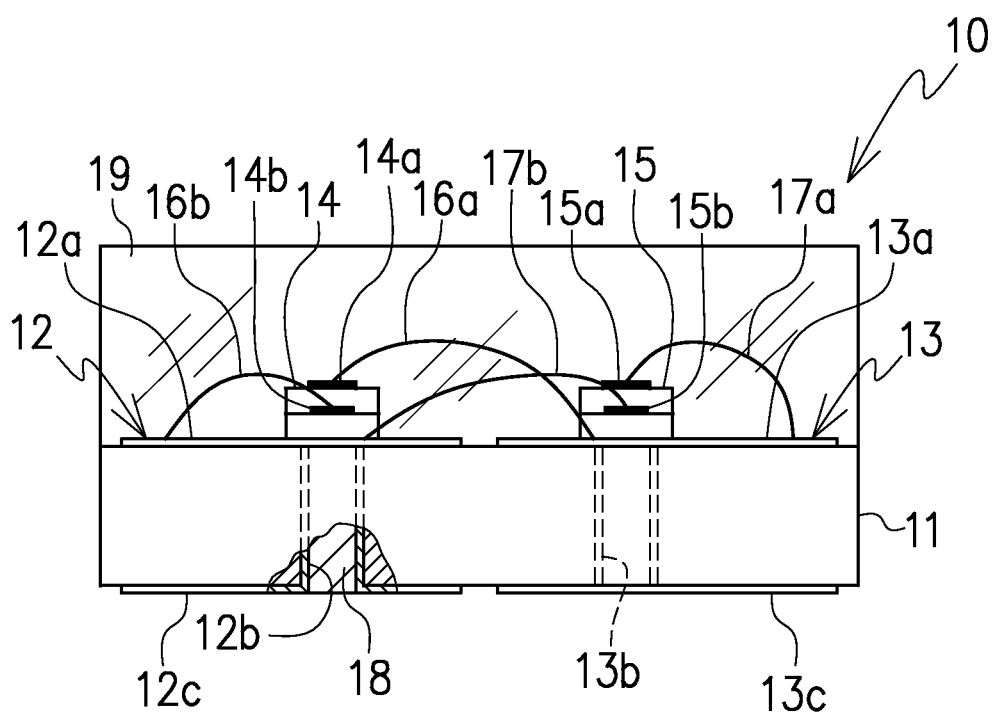
FIG. 2 is a side view of the light-emitting device illustrated in FIG. 1.

FIGS. 1 and 2 show a light-emitting device 10 according to a first embodiment of the present invention. The light-emitting device 10 according to the present embodiment shows a structure where at least two LED elements are connected in parallel with each other and configured to be one pair of LED elements, as an embodiment.

As shown in FIGS. 1 and 2, the light-emitting device 10 of the present embodiment includes a substrate 11, a first electrode 12 and a second electrode 13 that are adjacently arranged on the upper surface of the substrate 11 with a gap 11a between the first electrode 12 and the second electrode 13, and a first LED element 14 is mounted on the first electrode 12 and a second LED element 15 is mounted on the second electrode 13. The first electrode 12 includes a first upper surface electrode 12a and a first lower surface electrode 12c electrically connected to the first upper surface electrode 12a via a first through-hole 12b, and the second electrode 13 includes a second upper surface electrode 13a and a second lower surface electrode 13c electrically connected to the second upper surface electrode 13a via a second through-hole 13b. The first lower surface electrode 12c and the second lower surface electrode 13c are configured to be power supply terminals.

The first LED element 14 is arranged on the first electrode 12 at a slightly inward from a substantially central area of the first electrode 12 above the first through hole 12b, and the second LED element 15 is arranged on the second electrode 13 at a slightly inward from a substantially central area of the second electrode 13 above the second through-hole 13. In other words, the first LED element 14 is arranged on and adhered through an adhesive such as a heat-conductive adhesive to the first electrode with the first LED element 14 insulated from the first electrode, and the second LED element 15 is arranged on and adhered through an adhesive such as a heat-conductive adhesive to the second electrode with the second LED element 15 insulated from the second electrode.

The first LED element 14 includes a pair of element electrodes on an upper surface of the first LED element 14, the second LED element 15 includes a pair of element electrodes on an upper surface of the second LED element 15. More specifically, the first LED element 14 includes a p-element electrode as a first element electrode 14a and an n-element electrode as a second element electrode 14b on the upper surface of the first LED element 14. The second LED element 15 includes a p-element electrode as a first element electrode 15a and an n-element electrode as a second element electrode 15b on the upper surface of the second LED element 15.

In the first LED element 14, the first element electrode 14a that is the p-element electrode is electrically connected by a wire 16a to an inner portion of the second electrode 13, and the second element electrode 14b that is the n-element electrode 14b is electrically connected by a wire 16b to an outer portion of the first electrode 12. In the second LED element 15, the second element electrode 15b that is the n-element electrode 15b is electrically connected by a wire 17b to an inner portion of the first electrode 12, and the first element electrode that is the p-element electrode 15a is electrically connected by a wire 17a to an outer portion of the second electrode 13. In this way, the first LED element 14 and the second LED element 15 are electrically connected in parallel.

The substrate 11 is a glass epoxy resin substrate, for example. As described above, the first through-hole 12b electronically connecting the first upper surface electrode 12a and a first lower surface electrode 12c of the first electrode 12 is provided in the substrate 11, and the second through-hole 13b electrically connecting the first upper surface electrode 13a and a second lower surface electrode 13c of the second electrode 13 is provided in the substrate 11.

A sealing resin 19 covering the first LED element 14 and the second LED element 15, the first electrode 12 and the second electrode 13, and the wires 16a, 16b, 17a and 17b is disposed on the upper surface of the substrate 11. A transparent silicone resin or a light-transmitting silicone resin may be used as the sealing resin 19.

As described above, in the light-emitting device 10 of the present embodiment, the first electrode 12 and the second electrode 13 are arranged on the upper surface of the substrate 11 with the gap 11a between the first electrode 12 and the second electrode 13 provided at the central portion of the upper surface of the substrate 11, and the first LED element 14 is disposed on the first electrode 12 and the second LED element 15 is disposed on the second electrode 13, respectively. Thus, heat generated from the first LED element 14 is allowed to be effectively dissipated through the first electrode 12 on that the first LED element 14 is mounted, and heat generated from the second LED electrode 13 is allowed to be effectively dissipated through the second electrode 13 on that the second LED element 15 is mounted. Further, if the first LED element 14 is mounted on the first upper surface electrode of the first electrode 12 to cover from above the first through-hole 12b that is filled with a heat conductor 18 such as a solder and the second LED element 15 is mounted on the second upper surface electrode of the second electrode 13 to cover from above the second through-hole 13b that is filled with the heat conductor 18 such as a solder, heat generated from the first LED element and the second LED element can be released to the heat conductor 18. Accordingly, it is possible to enhance the heat releasing efficiency.

Second Embodiment

Figure 3:
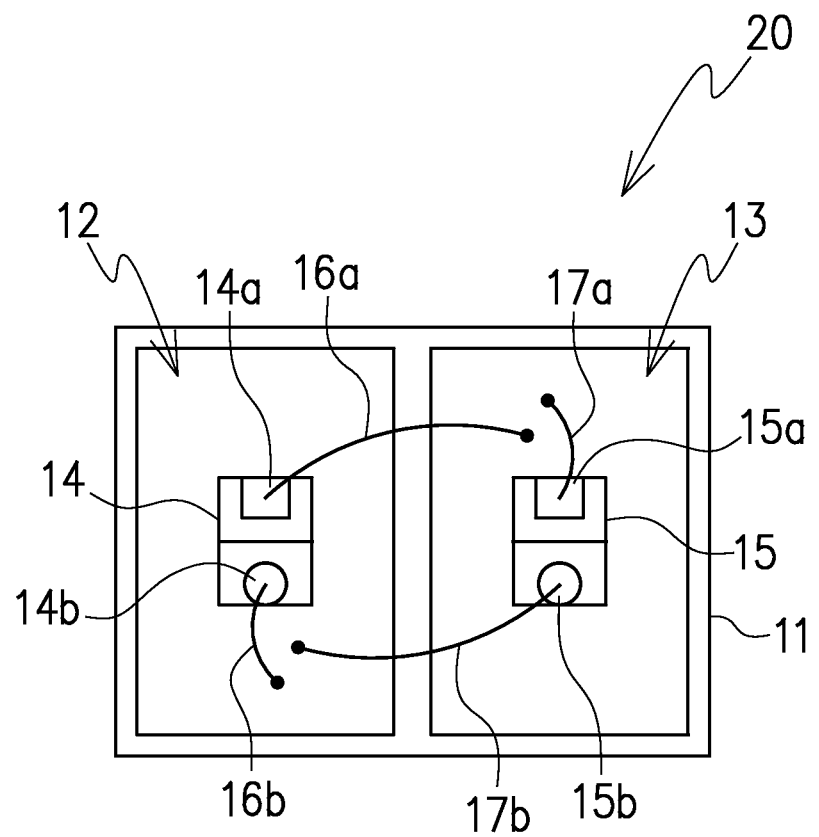
FIG. 3 is a plan view showing a light-emitting device according to a second embodiment of the present invention.

FIG. 3 shows a light-emitting device 20 according to a second embodiment of the present invention. The light-emitting device 20 of the present embodiment includes a substantially same structure as that of the first embodiment, except with respect to the wire connection, in that the wire 16b connects the n-element electrode 14b of the first LED element 14 to the first electrode 12, and the wire 17a connects the p-element electrode 15a of the second LED element 15 to the second electrode 13, and the wires 16b and 17a are bonded to positions on the first electrode and the second electrode, the positions here being different from the corresponding bonding positions of the first embodiment. Accordingly, the same constituent elements are denoted by the same reference numerals, and will not be described in detail.

As shown in FIG. 3, in the light-emitting device 20 according to the present embodiment, the wire 16b connecting the n-element electrode 14b of the first LED element 14 and the first electrode 12 is bonded to a first inner portion of the first electrode 12, more specifically, bonded to a position adjacent to a position where the wire 17b electrically connecting the n-element electrode 15b of the second LED element 15 is bonded to the first electrode 12. Meanwhile, the wire 17a connecting the p-element electrode 15a of the second LED element 15 and the second electrode 13 is bonded to a second inner portion of the second electrode 13, more specifically, bonded to a position adjacent to a position where the wire 16a electrically connecting the p-element electrode 14a of the first LED element 14 is bonded to the second electrode 13. In this way, the first LED element 14 and the second LED element 15 are electrically connected in parallel.

In the present embodiment, the position of the first LED element 14 mounted on the first electrode 12 and the position of the second LED element 15 mounted on the second electrode 13 are the same as the those corresponding positions of the first LED element and the second LED element in the first embodiment. Accordingly, as shown in FIG. 3, the size of the substrate 11 can be reduced from the size of the substrate the first embodiment, and thus, the size of the light-emitting device 20 can be reduced.

Third Embodiment

Figure 4:
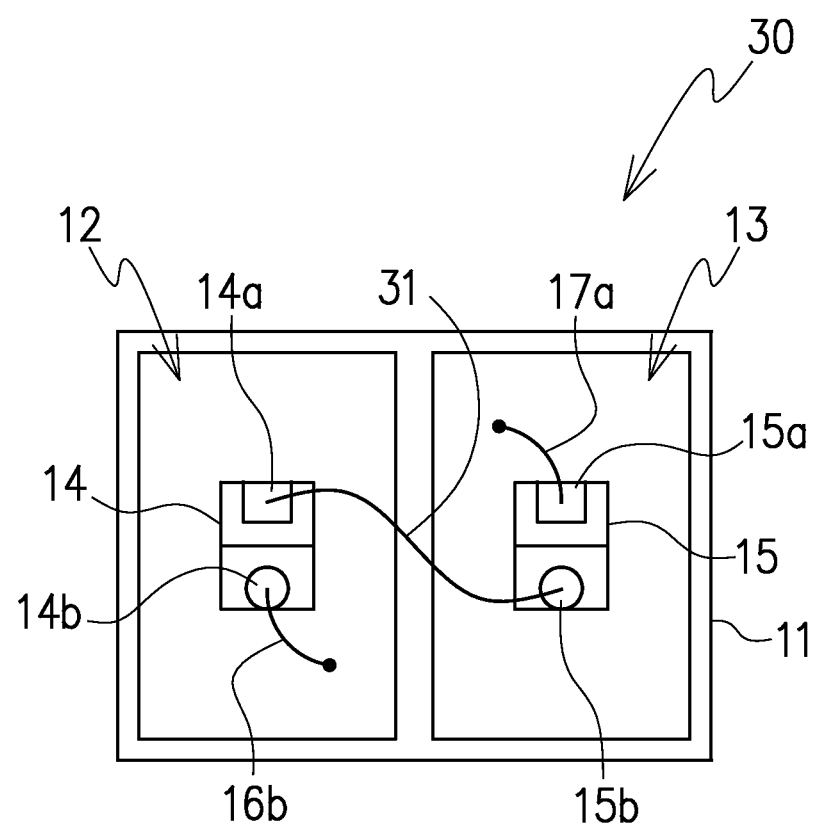
FIG. 4 is a plan view showing a light-emitting device according to a third embodiment of the present invention.

FIG. 4 shows a light-emitting device 30 according to a third embodiment of the present invention. The light-emitting device 30 of the present embodiment includes a substantially same structure as that of the second embodiment, except the wire connection in that the p-element electrode 14a of the first LED element 14 and the n-element electrode 15b of the second LED element 15 are directly connected by a single wire 31. Accordingly, the same constituent elements are denoted by the same reference numerals, and will not be described in detail. In the present embodiment, the first LED elements 14 and the second LED element 15 is connected electrically in series.

Fourth Embodiment

Figure 5:
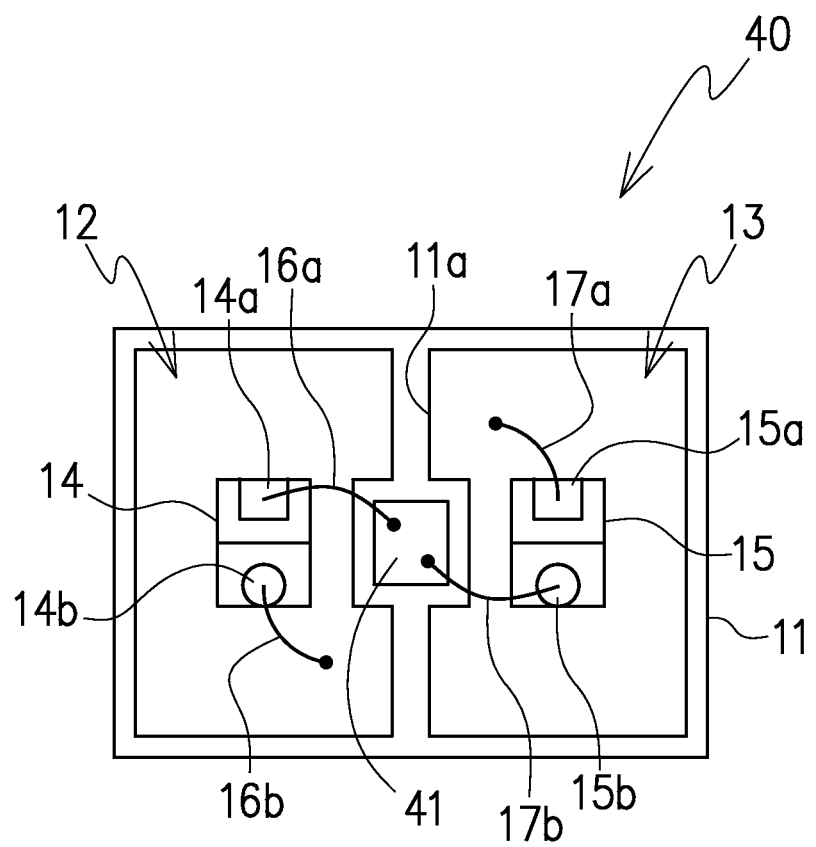
FIG. 5 is a plan view showing a light-emitting device according to a fourth embodiment of the present invention.

FIG. 5 shows a light-emitting device 40 according to a fourth embodiment of the present invention. The light-emitting device 40 of the present embodiment includes substantially the same structure as that of the third embodiment, except that a third electrode 41 is provided in the gap 11a between the first electrode 12 and the second electrode 13, for example in a central area of the gap 11a as shown in the drawing, and the p-element electrode 14a of the first LED element 14 and the n-element electrode 15b of the second LED element 15 are connected through the third electrode 41. Accordingly, the same constituent elements are denoted by the same reference numbers, and will not be described in detail.

The third electrode 41 is electrically isolated from the first electrode 12 and the second electrode 13. The third electrode 41 is connected to the p-element electrode 14a of the first LED element 14 by the wire 16a, and is connected to the n-element electrode 15b of the second LED element 15 by the wire 17b. As a result, the p-element electrode 14a of the first LED element 14 is electrically connected to the n-element electrode 15b of the second LED element 15 through the third electrode 41. Accordingly, similar to the third embodiment, the first LED element 14 and the second LED element 15 are electrically connected in series in the present embodiment.

In the light-emitting device of the present embodiment, the third electrode is used as an intermediary that allows reduction of a length of a wire, compared to the case where the first element electrode 14a of the first LED element 14 and the second element electrode 15b of the second LED element 15 are directly connected by a single wire. Accordingly, it is possible to prevent a wire from being broken and thus, a reliability of the light-emitting device can be increased.

Fifth Embodiment

Figure 6:
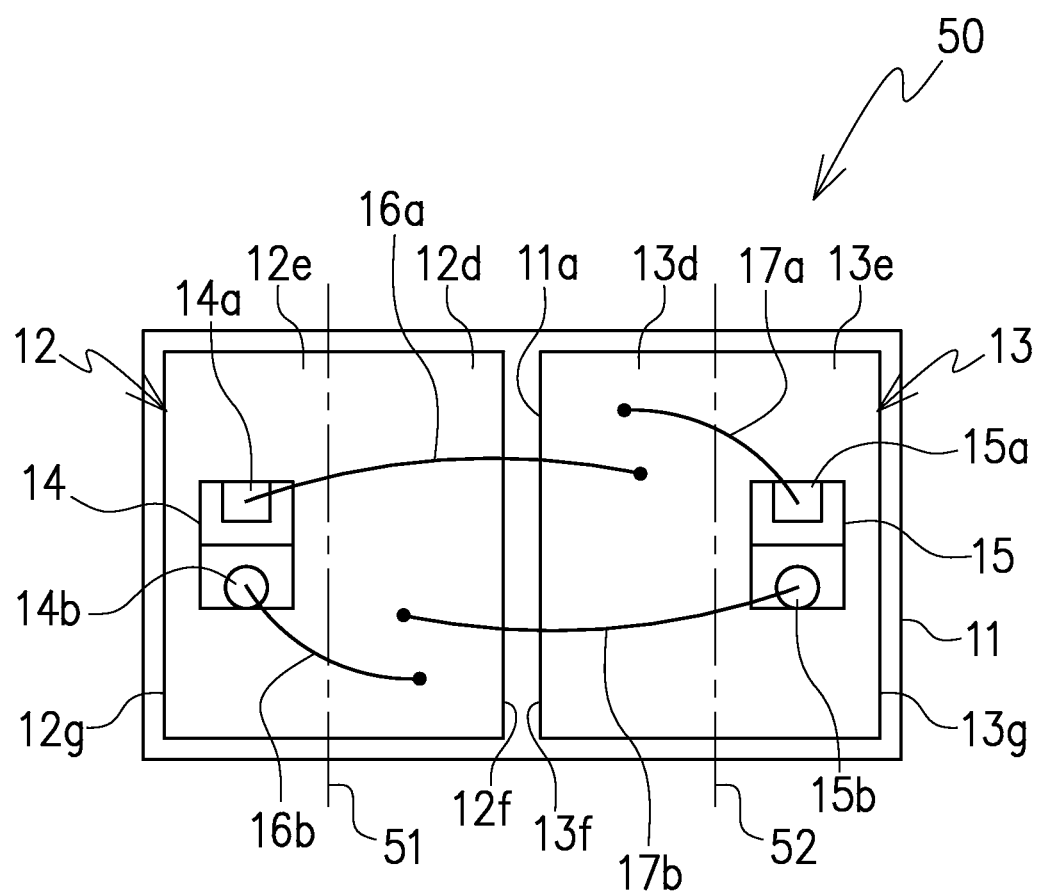
FIG. 6 is a plan view showing a light-emitting device according to a fifth embodiment of the present invention.
Figure 7:
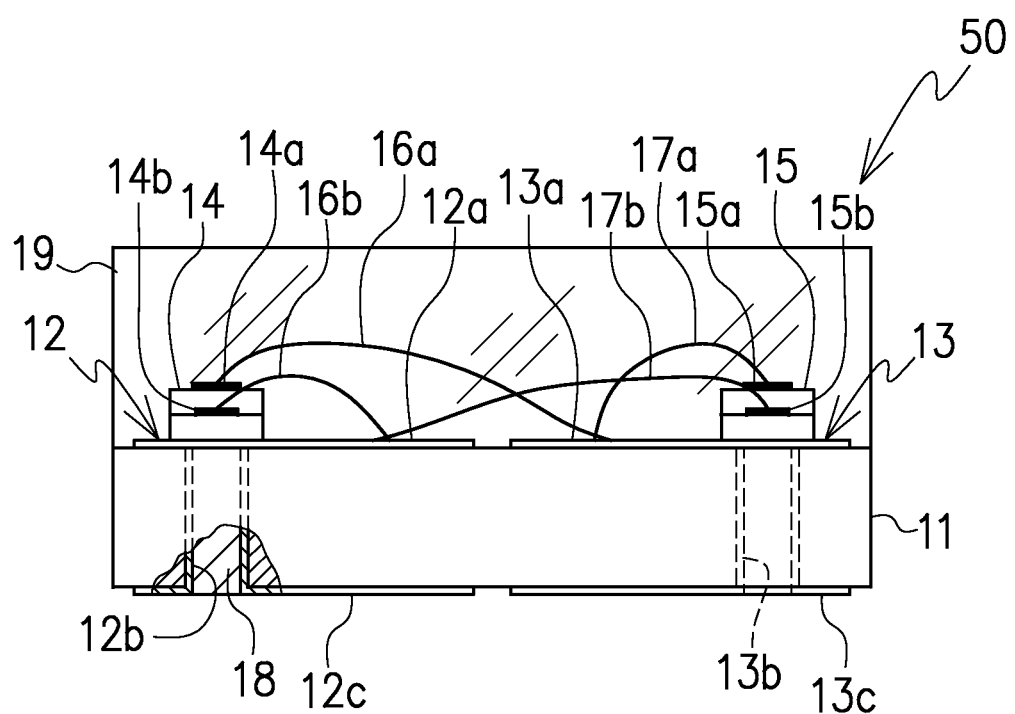
FIG. 7 is a side view of the light-emitting device illustrated in FIG. 6.

FIGS. 6 and 7 show a light-emitting device according to a fifth embodiment of the present invention. The light-emitting device 50 of the present embodiment includes a substantially same structure as that of the second embodiment, except that the first LED element 14 is mounted on the first electrode 12 at a position different from the corresponding position disclosed in the second embodiment and the second LED element 15 is mounted on the second electrode 13 at a position different from the corresponding position disclosed in the second embodiment. Accordingly, the same constituent elements are denoted by the same reference numbers, and will not be described in detail.

As shown in FIG. 6, in the light-emitting device 50 of the present embodiment, the first electrode 12 includes a first inner portion 12d adjacent to the gap 11a and a first outer portion 12e positioned on an outside of the inner portion 12d, and the second electrode 13 includes a second inner portion 13d adjacent to the gap 11a and a second outer portion 13e positioned on the outside of the second inner portion 13d. The first inner portion 12d of the first electrode 12 includes a first inner edge 12f that defines a first side of the gap 11a between the first electrode 12 and the second electrode 13, the second inner portion 13d of the second electrode 13 includes as a second inner edge 13f that defines a second side of the gap 11a between the first electrode 12 and the second electrode 13. Further, the first outer portion 12e of the first electrode 12 includes a first outer edge 12g at an opposite side of the first inner edge 12f of the first inner portion 12d and is an area positioned outside of a center line 51 between the first inner edge 12f and the first outer edge 12g, and the second outer portion 13e of the second electrode 13 includes a second outer edge 13g at an opposite side of the second inner edge 13f of the second inner portion 13d, and is an area positioned outside of a center line 52 between the second inner edge 13f and the second outer edge 13f.

Further, in the present embodiment, the first through-hole 12b for electrical connection between the first upper surface electrode 12a and the first lower surface electrode 12c of the first electrode 12 is provided at the first outer portion 12e of the first electrode 12, and the second through-hole 13b for electrical connection between the second upper surface electrode 13a and the second lower surface electrode 13c of the second electrode 13 is provided in the second outer portion 13e of the second electrode 13.

The first LED element 14 is mounted on the first upper surface electrode 12a to cover the first through-hole 12b at the first outer portion 12e, and the second LED element is mounted on the second upper surface electrode 13a to cover the second through-hole 13b at the second outer portion 13e of the second electrode 13. Regarding the pair of element electrodes provided on the upper surface of the first LED element 14, the first element electrode 14a as the p-element electrode is electrically connected by the wire 16a to the second inner portion 13d of the second electrode 13, and the second element electrode as the n-element electrode 14b is electrically connected by the wire 16b to the first inner portion 12d of the first electrode 12. Also, regarding the pair of element electrodes provided on the upper surface of the second LED element 15, the second element electrode as the n-element electrode 15b is electrically connected by the wire 17b to the first inner portion 12d of the first electrode 12, and the first element electrode as the p-element electrode 15a is electrically connected by the wire 17a to the second inner portion 13d of the second electrode 13. In the present embodiment, the first LED element 14 and the second LED element 15 are electrically connected to each other in parallel.

Similar to the second embodiment, in the light-emitting device 50 according to the present embodiment, heat generated from the first LED element 14 is allowed to be effectively dissipated through the first electrode 12 and the first through-hole 12b on that the first LED element 14 is mounted, and heat generated from the second LED element 15 is allowed to be effectively dissipated through the second electrode 13 and the second through-hole 13b on that the second LED element 15 is mounted. Further, the first LED element 14 is mounted on the first outer portion 12e of the first electrode 12, and the second LED element 15 is mounted on the second outer portion 13e of the second electrode 13. Accordingly, as a distance from the first LED element 14 to the gap 11a is increased and a distance from the second LED element 15 to the gap 11a is increased, the amount of light emission from the first LED element 14 and the second LED element 15 affecting an upper surface of the substrate appearing in the gap 11a can be reduced, and thus, it is possible to avoid a deterioration of substrate caused by light exposure.

Sixth Embodiment

Figure 8:
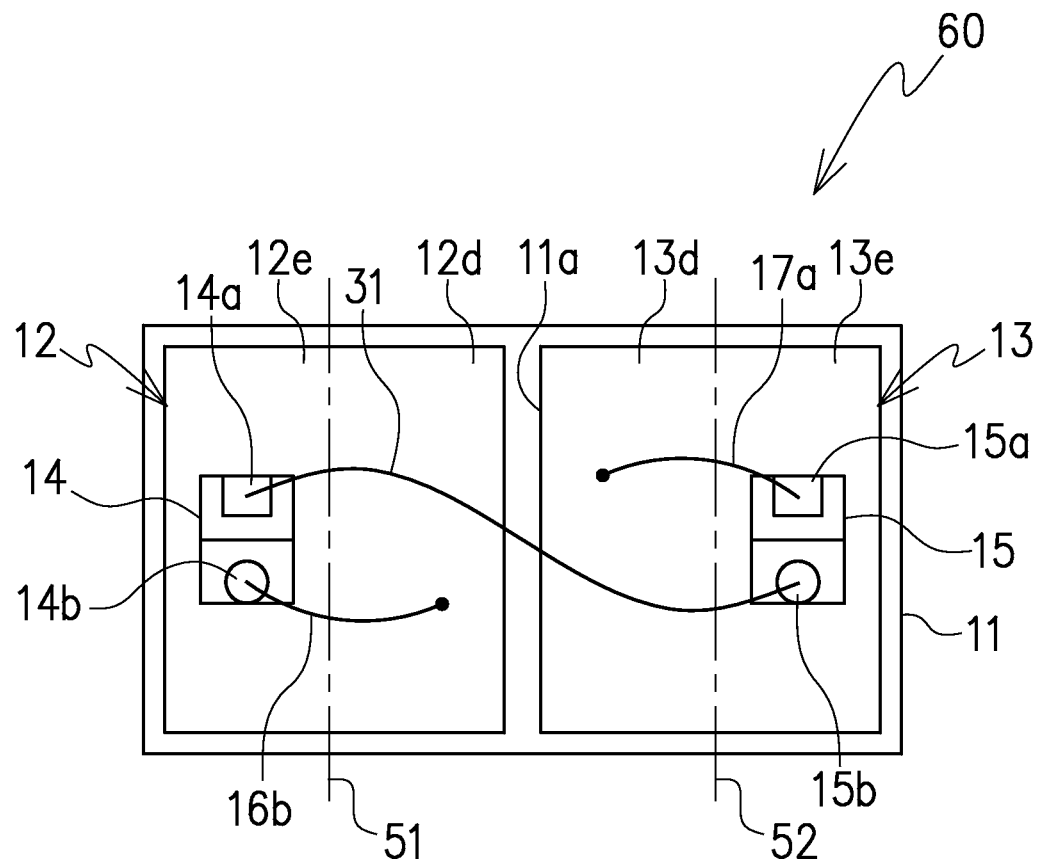
FIG. 8 is a plan view showing a light-emitting device according to a sixth embodiment of the present invention.

FIG. 8 shows a light-emitting device according to a sixth embodiment of the present invention. The light-emitting device 60 of the present embodiment includes a substantially same structure as that of the fifth embodiment, except that the p-element electrode 14a of the first LED element 14 and the n-element electrode 15b of the second LED element 15 are directly connected by the single wire 31. Accordingly, the same constituent elements are denoted by the same reference numbers, and will not be described in detail. In the present embodiment, the first LED element 14 and the second LED element 15 are electrically connected in series.

Similar to the fifth embodiment described previously, the light-emitting device 60 according to the present embodiment achieves a good effect of heat release and effectively suppresses a deterioration of the substrate 11.

Seventh Embodiment

Figure 9:
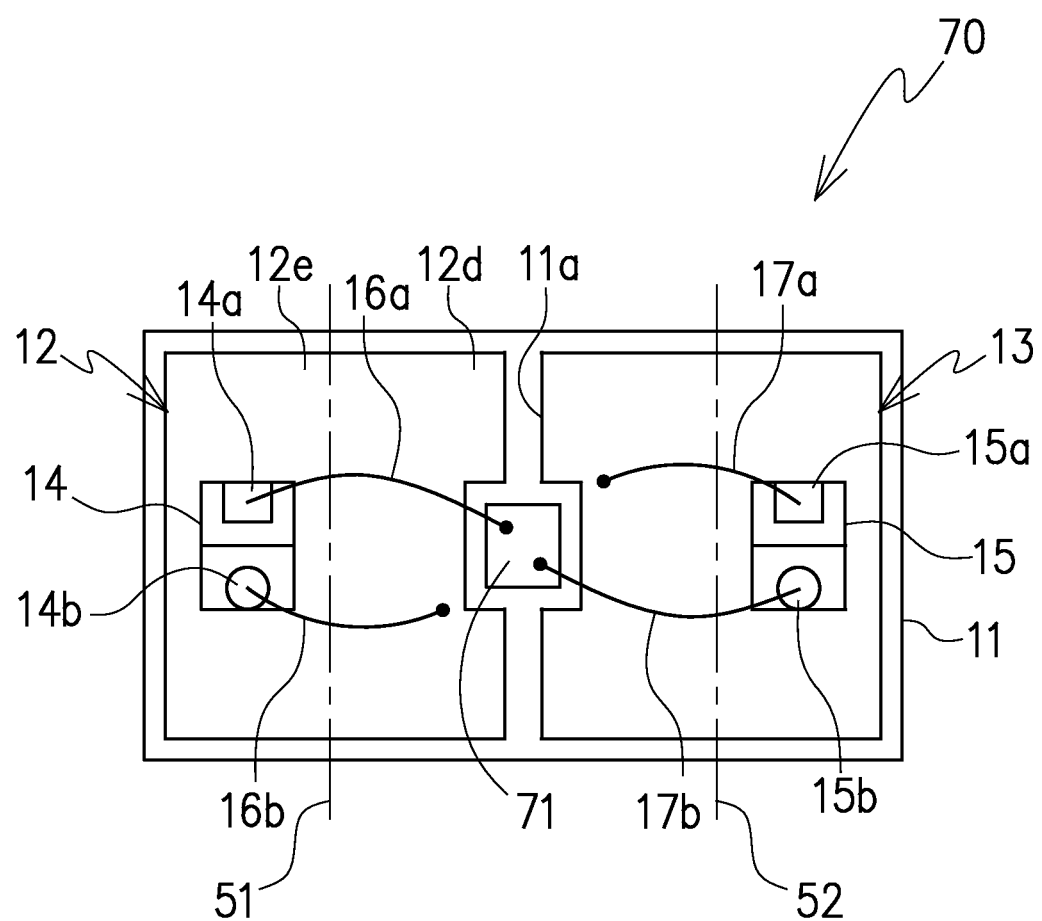
FIG. 9 is a plan view showing a light-emitting device according to a seventh embodiment of the present invention.

FIG. 9 shows a light-emitting device 70 according to a seventh embodiment of the present invention. The light-emitting device 70 of the present embodiment includes a similar structure as that of the sixth embodiment, except that a third electrode 71 is provided in the gap 11a between the first electrode 12 and the second electrode 13, and that the p-element electrode 14a of the first LED element 14 and the n-element electrode 15b of the second LED element 15 are connected through the third electrode 71. Accordingly, the same constituent elements are denoted by the same reference numbers, and will not be described in detail.

Like the third electrode 41 of FIG. 5 described in the fourth embodiment, the third electrode 71 is electrically isolated from the first electrode 12 and the second electrode 13. The third electrode 71 is connected to the p-element electrode 14a of the first LED element 14 by the wire 16a, and the third electrode 71 is connected to the n-element electrode 15b of the second LED element 15 by the wire 17b. As a result, the first element electrode 14a of the first LED element 14 and the second element electrode 15b of the second LED element 15 are electrically connected through the third electrode 71. Accordingly, in the present embodiment, the first LED element 14 and the second LED element 15 are electrically connected in series.

Similar to the fourth embodiment, in the light-emitting device 70 of the present embodiment, the third electrode 71 that exists as an intermediary allows reduction of the a length of a wire, compared to the case where the first element electrode 14a of the first LED element 14 and the second element electrode 15b of the second LED element 15 are directly connected by a single wire. Accordingly, it is possible to prevent a wire from being broken and thus, reliability of the light-emitting device can be increased.

Eighth Embodiment

Figure 10:
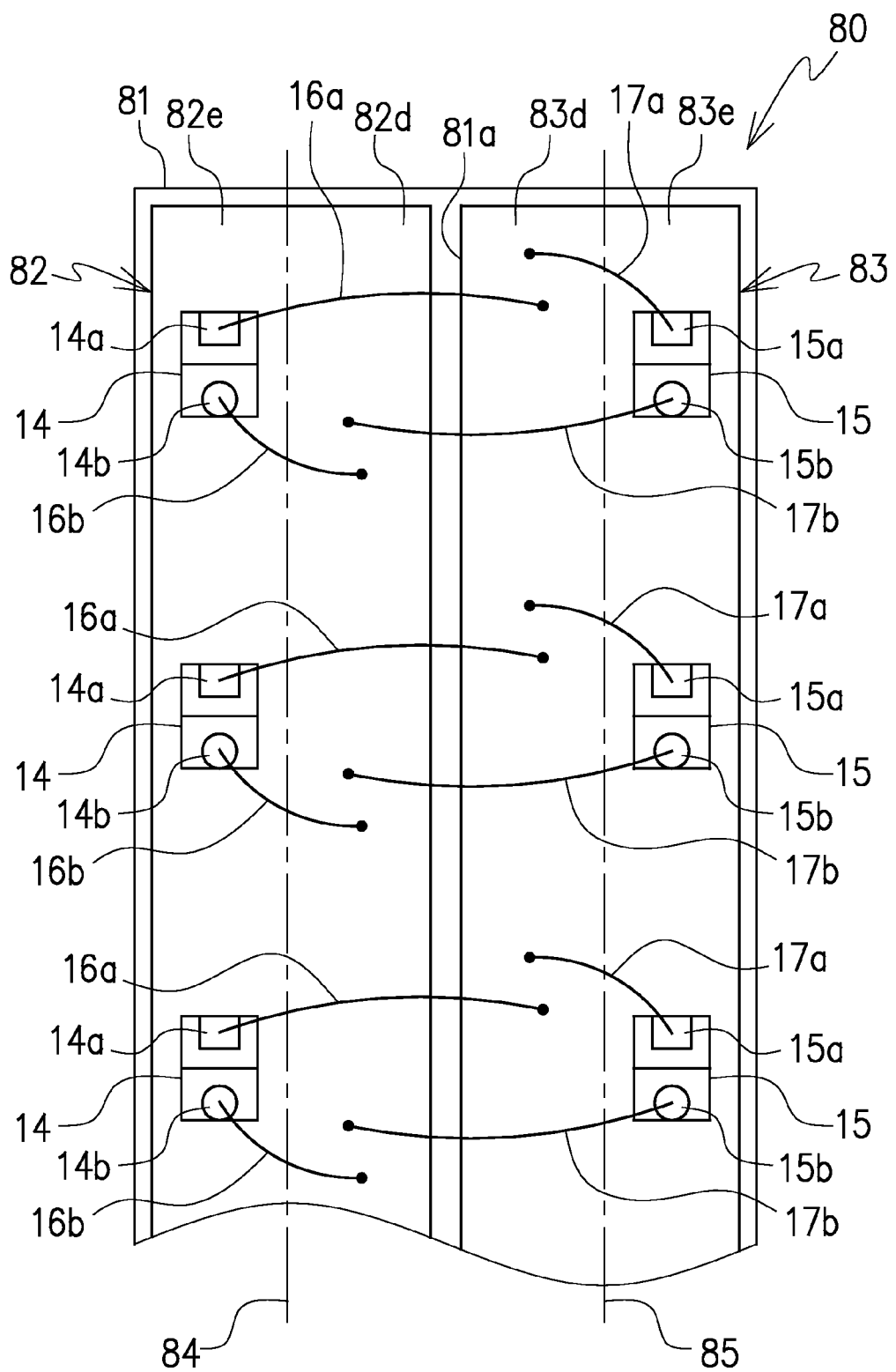
FIG. 10 is a plan view showing a light-emitting device according to an eighth embodiment of the present invention, in a state where a large number of LED element pairs are arranged.

FIG. 10 shows a light-emitting device 80 according to an eighth embodiment of the present invention. In the light-emitting device 80 of the present embodiment, the first LED element 14 and the second LED element 15 described in the fifth embodiment form one pair, and a plurality of such pairs are arranged on an elongated substrate 81. More specifically, as shown in FIG. 10, an elongated first electrode 82 and an elongated second electrode 83 that includes a substantially same shape as the first electrode 82 are formed on the upper surface of the elongated substrate 81, and a gap 81a in the form of a slit extending in a shape of a straight line is provided between the first electrode 82 and the second electrode 83. Similar to the fifth embodiment, the first electrode 82 includes a first inner portion 82d adjacent to the gap 81a and a first outer portion 82e positioned on the outside of the first inner portion 82d at both sides of the center line 84 and the second electrode 83 includes a second inner portion 83d adjacent to the gap 81a and the second outer portion 83e positioned on the outside of the second inner portion 83d at both sides of the center line 85. Similar to the fifth embodiment, the first through-hole and the second through-hole (not shown in the drawing) filled with a heat conductor 18 such as solder, and the first through-hole is provided at a position of the first outer portion 82e on that the first LED element is arranged and the second through-hole is provided at a position of the second outer portion 83e on that the second LED element is arranged.

The first LED element 14 and the second LED element 15 form one pair, and a plurality of such pairs are arranged on the first outer portion 82e of the first electrode 82 in a longitudinal direction of a first electrode 82 and the second outer portion 83e of the second electrode 83 in a longitudinal direction of the second electrode. Similar to the fifth embodiment, regarding all of the arranged first LED elements 14, the p-element electrode 14a of the first LED elements are electrically connected by the wires 16a to the second inner portion 83d of the second electrode 83, and the n-element electrodes 14b of the first LED elements are electrically connected by the wires 16b to the first inner portion 82d of the first electrode 82. Similar to the fifth embodiment, regarding all of the arranged second LED elements 15, the n-element electrodes 15b of the second electrode 15 are electrically connected by the wires 17b to the first inner portion 82d of the first electrode 82, and the p-element electrodes 15a of the second electrode 15 are electrically connected by the wires 17a to the second inner portion 83d of the second electrode 83. The structure is substantially same in other respects as that of the fifth embodiment described on the basis of FIGS. 6 and 7, and accordingly, it will not be described in detail.

As described above, in the light-emitting device 80 according to the present embodiment, the first LED element 14 and the second LED element 15 form one pair, and in each of a plurality of such pairs, the first LED element 14 and the second LED element 15 are electrically connected in parallel. As a result, light can appear to be uniform from the entire light-emitting device 80. Further, a great amount of heat generated from a plurality of the first LED elements and the second LED elements is allowed to be efficiently dissipated through corresponding electrodes.

Ninth Embodiment

Figure 11:
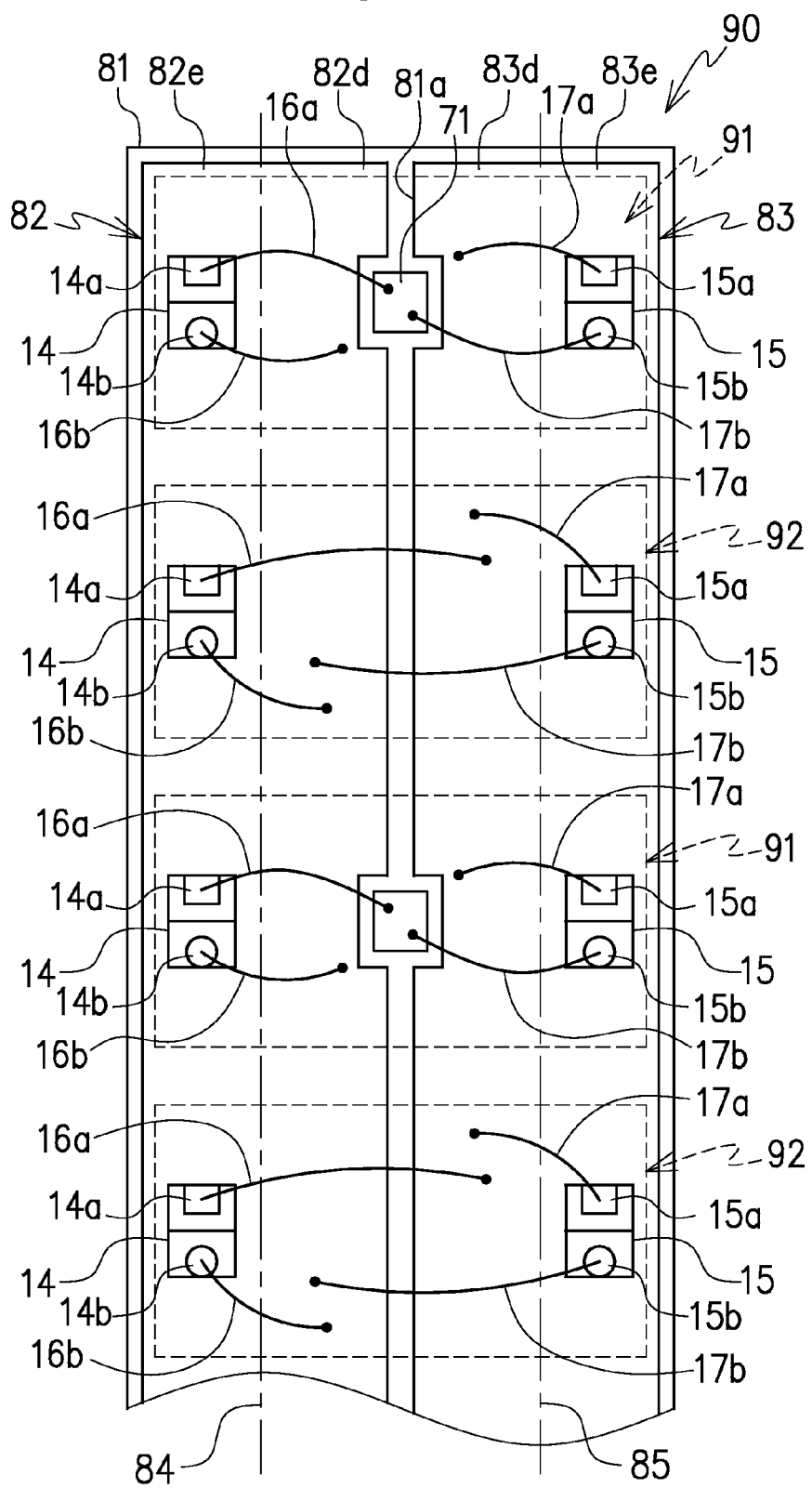
FIG. 11 is a plan view showing a light-emitting device according to a ninth embodiment of the present invention, in a state where a large number of LED element pairs are arranged.
Figure 12:
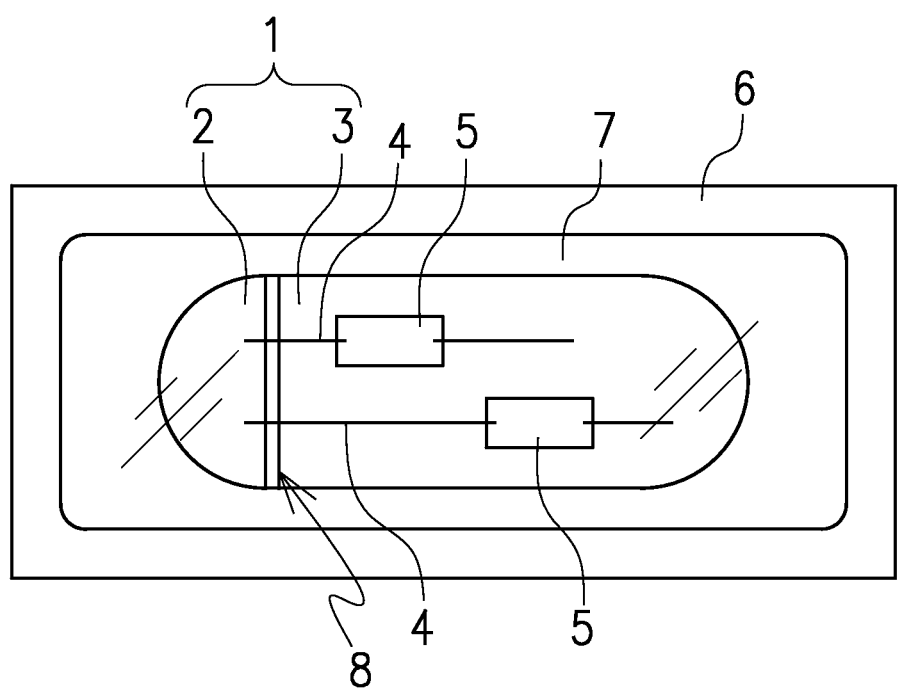
FIG. 12 is a plan view showing an example of a conventional light-emitting device.

FIG. 11 shows a light-emitting device 90 according to a ninth embodiment of the present invention. The light-emitting device 90 of the present embodiment has a structure composed of a combination of the light-emitting device of the fifth embodiment shown in FIG. 6 and the light-emitting device of the seventh embodiment shown in FIG. 9. More specifically, as shown in FIG. 11, an elongated first electrode 82 and an elongated second electrode 83 that includes a substantially same shape as the elongated first electrode 82 are provided on the upper surface of an elongated substrate 81. Further, a pair 91 of the first LED element and the second LED element connected electrically in series and a pair 92 of the first LED element and the second LED element electrically connected in parallel are alternately arranged in the elongated direction of the first electrode 82 and the second electrode 83. Electrical connections between the first LED element 14 and the second LED element 15 in each of pairs through wires are the same as those described in the fifth and seventh embodiments, and therefrom a detail description is omitted.

In the present embodiment, the pairs 91 of series-connected first LED elements and second LED elements and the pairs 92 of parallel-connected first LED elements and second LED elements are alternately arranged one pair by one pair. However, the present invention is not limited to this. By way of example, two pairs 91 of series-connected first LED elements and second LED elements and two pairs 92 of parallel-connected first LED elements and second LED elements may be alternately arranged in turn. Further, pairs of series-connected first LED elements and second LED elements and pairs of parallel-connected first LED elements and second LED elements to be arranged alternately are not always required to be the same in number. Additionally, the pair 91 of first LED elements and second LED element forming the pair 91 may not be always connected in series by the connection structure shown in the seventh embodiment, but they may be connected in series by the connection structure of the sixth embodiment shown in FIG. 8, for example.

In the light-emitting device 90 of the present embodiment, series connection and parallel connection can be combined freely, where appropriate, for connection of the first LED elements and the second LED elements in pairs to be mounted on the single substrate 81. Further, if the first LED element and the second LED element arranged in a plurality of pairs are mounted on the single substrate 81, a great amount of heat is generated from the first LED elements and the second LED elements. In this case, the heat is allowed to be efficiently dissipated.

Although not specifically described above, the first LED element and the second LED element of each embodiment can be selected appropriately from a red LED element, a green LED element, a blue LED element, and the like. Additionally, the sealing resin may also be a phosphor containing resin. The resin may be made of a silicone resin that can contain various fluorescent substances, for example.

It is to be understood that the present invention is not limited to the embodiments described above, but various modifications and changes can be made to the embodiments.

REFERENCE SIGNS LIST 10, 20, 30, 40, 50, 60, 70, 80, 90 light-emitting device
11, 81 substrate
11a, 81a gap
12, 82 first electrode
12a, 13a first upper surface electrode, second upper surface electrode
12b, 13b first through-hole, second through-hole
12c, 13c first lower surface electrode, second lower surface electrode
12d, 13d first inner portion, second inner portion
12e, 13e first outer portion, second outer portion
12f, 13f first inner edge, second inner edge
12g, 13g first outer edge, second outer edge
13, 83 second electrode
14 first LED element
15 second LED element
14a, 15a p-element electrode (first element electrode)
14b, 15b n-element electrode (second element electrode)
16a, 16b wire
17a, 17b wire
18 heat conductor
19 sealing resin
31 wire
41 third electrode
51, 52, 84, 85 center line
71 third electrode
91 pairs of series-connected LED elements
91 pairs of parallel-connected LED elements

The invention claimed is:

1. A light-emitting device comprising:
a substrate;
a first electrode and a second electrode formed on an upper surface of the substrate with a gap between the first electrode and the second electrode, the gap being provided at a central portion of the upper surface of the substrate;
at least one first light-emitting diode element mounted on the first electrode; and
at least one second light-emitting diode element mounted on the second electrode, wherein
the first light-emitting diode element includes a pair of element electrodes as a first element electrode and a second element electrode on an upper surface of the first light-emitting diode element and the second light-emitting diode element includes a pair of element electrodes as a first element electrode and a second element electrode on an upper surface of the second light-emitting diode element,
the first light-emitting diode element is connected by a wire to at least one of the first electrode and the second electrode, and the second light-emitting diode element is connected by a wire to at least one of the first electrode and the second electrode, wherein
the first electrode includes a first upper surface electrode and a first lower surface electrode electrically connected to the first upper surface electrode via a first through-hole provided in the substrate, and the second electrode includes a second upper surface electrode and a second lower surface electrode electrically connected to the second upper surface electrode via a second through-hole provided in the substrate,
the first light-emitting diode element is mounted on the first upper surface electrode of the first electrode to cover the first through-hole, and the second light-emitting diode element is mounted on the second upper surface electrode of the second electrode to cover the second through-hole, and
at least one of the first and second upper surface electrodes and the first and second lower surface electrodes of the first electrode and the second electrode is configured to be a power supply terminal to each of the first electrode and the second electrode.

2. The light-emitting device according to claim 1, wherein:
the first element electrode of the pair of element electrodes of the first light-emitting diode element is connected by a wire to the second electrode, and the second element electrode of the pair of element electrodes of the first light-emitting diode element is connected by a wire to the first electrode; and the first element electrode of the pair of element electrodes of the second light-emitting diode element is connected by a wire to the first electrode, and the second element electrode of the pair of element electrodes of the second light-emitting diode element is connected by a wire to the second electrode.

3. The light-emitting device according to claim 2, wherein the first light-emitting diode element and the second light-emitting diode element are electrically connected in parallel to each other.

4. The light-emitting device according to claim 1, wherein:
the first element electrode of the pair of element electrodes of the first light-emitting diode element is connected to the second element electrode of the second light-emitting diode element, and the second element electrode of the pair of element electrodes of the first light-emitting diode element is connected by a wire to the first electrode; and
the second element electrode of the pair of element electrodes of the second light-emitting diode element is connected to the first element electrode of the first light-emitting diode element, and the first element electrode of the second light-emitting diode element is connected by a wire to the second electrode.

5. The light-emitting device according to claim 4, wherein the first light-emitting diode element and the second light-emitting diode element are electrically connected in series to each other.

6. The light-emitting device according to claim 4, wherein the first element electrode of the first light-emitting diode element and the second element electrode of the second light-emitting diode element are connected by a wire stretched between the first element electrode of the first light-emitting diode element and the second element electrode of the second light-emitting diode element.

7. The light-emitting device according to claim 4, wherein:
the first element electrode of the first light-emitting diode element and the second element electrode of the second light-emitting diode element are connected through a third electrode arranged between the first electrode and the second electrode; and the third electrode is connected by a wire to the first element electrode of the first light-emitting diode element, and is connected by a wire to the second element electrode of the second light-emitting diode element.

8. A light-emitting device comprising:

a substrate;

a first electrode and a second electrode formed on an upper surface of the substrate with a gap between the first electrode and the second electrode, the gap being provided at a central portion of the upper surface of the substrate;

at least one first light-emitting diode element mounted on the first electrode; and at least one second light-emitting diode element mounted on the second electrode, wherein the first light-emitting diode element includes a pair of element electrodes as a first element electrode and a second element electrode on an upper surface of the first light-emitting diode element and the second light-emitting diode element includes a pair of element electrodes as a first element electrode and a second element electrode on an upper surface of the second light-emitting diode element, the first light-emitting diode element is connected by a wire to at least one of the first electrode and the second electrode, and the second light-emitting diode element is connected by a wire to at least one of the first electrode and the second electrode, wherein the substrate includes an elongated shape, the first electrode includes an elongated shape extending along the elongated shape of the substrate and the second electrode includes an elongated shape extending along the elongated shape of the substrate, an elongated gap in the form of a slit is provided between the first electrode and the second electrode, a plurality of the first light-emitting diode elements are mounted on the first electrode and a plurality of the second light-emitting diode elements are mounted on the second electrode, the first light-emitting diode elements and the second light-emitting diode elements are disposed to be a plurality of pairs each with one first light-emitting diode element and one second light-emitting diode element, and in each pair of the plurality of pairs, the first light-emitting diode element is electrically connected to at least one of the first electrode and the second electrode by a wire, and the second light-emitting diode element is electrically connected to at least one of the first electrode and the second electrode by a wire.

9. A light-emitting device comprising:

a substrate;

a first electrode and a second electrode formed on an upper surface of the substrate with a gap between the first electrode and the second electrode, the gap being provided at a central portion of the upper surface of the substrate;

at least one first light-emitting diode element mounted on the first electrode; and at least one second light-emitting diode element mounted on the second electrode, wherein the first light-emitting diode element includes a pair of element electrodes as a first element electrode and a second element electrode on an upper surface of the first light-emitting diode element and the second light-emitting diode element includes a pair of element electrodes as a first element electrode and a second element electrode on an upper surface of the second light-emitting diode element, the first light-emitting diode element is connected by a wire to at least one of the first electrode and the second electrode, and the second light-emitting diode element is connected by a wire to at least one of the first electrode and the second electrode, wherein the first electrode includes a first inner portion adjacent to the gap and a first outer portion outside the first inner portion, and the second electrode includes a second inner portion adjacent to the gap and a second outer portion outside the second inner portion of the second electrode, the first inner portion of the first electrode includes a first inner edge and the second inner portion of the second electrode includes a second inner edge, and the first inner edge and the second inner edge demarcate the gap positioned between the first electrode and the second electrode, the first outer portion of the first electrode includes a first outer edge at an opposite side of the first inner edge and the first outer portion is an area positioned outside of a center line between the first inner edge and the first outer edge, the second outer portion of the second electrode includes a second outer edge at an opposite side of the second inner edge and the second outer portion is an area positioned outside of a center line between the second inner edge and the second outer edge, the first light-emitting diode element is mounted on the first outer portion of the first electrode and connected by a wire to at least one of the first inner portion of the first electrode and the second inner portion of the second electrode, the second light-emitting diode element is mounted on the second outer portion of the second electrode and connected by a wire to at least one of the first inner portion of the first electrode and the second inner portion of the second electrode, the outer portion of the first electrode includes a first upper surface electrode and a first lower surface electrode electrically connected to the first upper surface electrode via a first through-hole, and the outer portion of the second electrode includes a second upper surface electrode and a second lower surface electrode electrically connected to the second upper surface electrode via a second through-hole, the first light-emitting diode element is mounted on the first upper surface electrode to cover the first through-hole, and the second light-emitting diode element is mounted on the second upper surface electrode to cover the second through-hole, and at least one of the first and second upper surface electrodes and the first and second lower surface electrodes configured to be a power supply terminal of each of the first and second electrodes.

10. The light-emitting device according to claim 9, wherein:

the first element electrode of the pair of element electrodes of the first light-emitting diode element is connected by a wire to the second inner portion of the second electrode, and the second element electrode of the pair of element electrodes of the first light-emitting diode element is connected by a wire to the first inner portion of the first electrode; and the first element electrode of the pair of element electrodes of the second light-emitting diode element is connected by a wire to the first inner portion of the first electrode, and the second element electrode of the pair of element electrodes of the second light-emitting diode element is connected by a wire to the second inner portion of the second electrode.

11. The light-emitting device according to claim 9, wherein the first light-emitting diode elements and the second light-emitting diode elements are electrically connected in parallel.

12. The light-emitting device according to claim 9, wherein:
the first element electrode of the pair of element electrodes of the first light-emitting diode element is connected to the second element electrode of the second light-emitting diode element, and
the second element electrode of the pair of element electrodes of the first light-emitting diode element is connected by a wire to the first inner portion of the first electrode; and the second element electrode of the pair of element electrodes of the second light-emitting diode element is connected to the first element electrode of the first light-emitting diode element, and the first element electrode of the pair of element electrodes of the second light-emitting diode element is connected by a wire to the second inner portion of the second electrode.

13. The light-emitting device according to claim 12, wherein the first light-emitting diode element and the second light-emitting diode element are electrically connected in series to each other.

14. The light-emitting device according to claim 12, wherein the first element electrode of the first light-emitting diode element and the second element electrode of the second light-emitting diode element are connected by a wire stretched between the first element electrode of the first light-emitting diode element and the second element electrode of the second light-emitting diode element.

15. The light-emitting device according to claim 12, wherein:
the first element electrode of the first light-emitting diode element and the second element electrode of the second light-emitting diode element are connected through a third electrode arranged in the gap between the first electrode and the second electrode; and
the third electrode is connected by a wire to the first element electrode of the first light-emitting diode element, and is connected by a wire to the second element electrode of the second light-emitting diode element.

16. The light-emitting device according to claim 9, wherein:
the first electrode includes an elongated shape and the second electrode includes an elongated shape;
the gap that is an elongated gap in the form of a slit is provided between the inner edge of the first electrode and the inner edge of the second electrode;
a plurality of the first light-emitting diode elements are mounted on the outer portion of the first electrode, and a plurality of the second light-emitting diode elements are mounted on the outer portion of the second electrode, the first light-emitting diode elements and the second light-emitting diode elements are configured to be a plurality of pairs each with one first light-emitting diode element and one second light-emitting diode element; and
in each pair of the plurality of pairs, the first light-emitting diode element is electrically connected by a wire to at least one of the first inner portion of the first electrode and the second inner portion of the second electrode, and the second light-emitting diode element is connected by a wire to at least one of the first electrode and the second electrode.

17. The light-emitting device according to claim 16, wherein, in the pairs each with the first light-emitting diode element that is mounted on the outer portion of the first electrode and the second light-emitting diode element that is mounted on the outer portion of the second electrode, all of the pairs of the first light-emitting diode elements and the second light-emitting diode elements are connected in parallel, or parallel connection and series connection are formed alternately.

\* \* \* \* \*

UNITED STATES PATENT AND TRADEMARK OFFICE
CERTIFICATE OF CORRECTION

| | | |
|---|---|---|
| PATENT NO. | : 9,006,759 B2 | Page 1 of 1 |
| APPLICATION NO. | : 13/641293 | |
| DATED | : April 14, 2015 | |
| INVENTOR(S) | : Junji Miyashita et al. | |

It is certified that error appears in the above-identified patent and that said Letters Patent is hereby corrected as shown below:

IN THE SPECIFICATION
At column 10, line 56, delete "first LED elements" and insert --first LED element--.

Signed and Sealed this
Twenty-third Day of February, 2016

Michelle K. Lee
*Director of the United States Patent and Trademark Office*